United States Patent [19]

Zoltzer et al.

[11] Patent Number: 5,294,239
[45] Date of Patent: Mar. 15, 1994

[54] NICKEL-BASE SUPERALLOY

[75] Inventors: Klaus Zoltzer, Wollstadt; Klaus Lempenauer; Hellmut Fischmeister, both of Stuttgart, all of Fed. Rep. of Germany

[73] Assignee: PM Hochtemperatur-Metall GmbH, Frankfurt, Fed. Rep. of Germany

[21] Appl. No.: 695,855

[22] Filed: May 6, 1991

[30] Foreign Application Priority Data

May 7, 1990 [DE] Fed. Rep. of Germany ....... 4014614

[51] Int. Cl.$^5$ .............................................. C22C 29/06
[52] U.S. Cl. ........................................ 75/237; 75/233; 75/235; 75/236; 75/242; 420/446; 420/447; 420/448; 420/449
[58] Field of Search ............... 420/448, 446, 447, 449; 75/236, 237, 233, 235, 242

[56] References Cited

U.S. PATENT DOCUMENTS 3,368,888  2/1968  Winter et al. ........................ 420/448
3,890,816  6/1975  Allen et al. ......................... 420/448
5,154,884  10/1992 Wukusick et al. ................... 420/448

OTHER PUBLICATIONS

Rosenberg, Samuel, "Nickel and Its Alloys", U.S. Dept of Commerce, 1968, pp. 74–78.

*Primary Examiner*—Donald P. Walsh
*Assistant Examiner*—Daniel Jenkins
*Attorney, Agent, or Firm*—Sprung Horn Kramer & Woods

[57] ABSTRACT

In section bars and shaped bodies made of nickel-base superalloys having a structure consisting of columnar grains, a complete recrystallization cannot be effected unless the heating-up rate is kept below a maximum heating-up rate $T_{max}$, which depends on the ratio V of one or more of the metal carbide-forming elements hafnium, niobium, tantalum, titanium and zirconium to one or both of the metal carbide-forming elements tungsten and molybdenum.

4 Claims, 1 Drawing Sheet

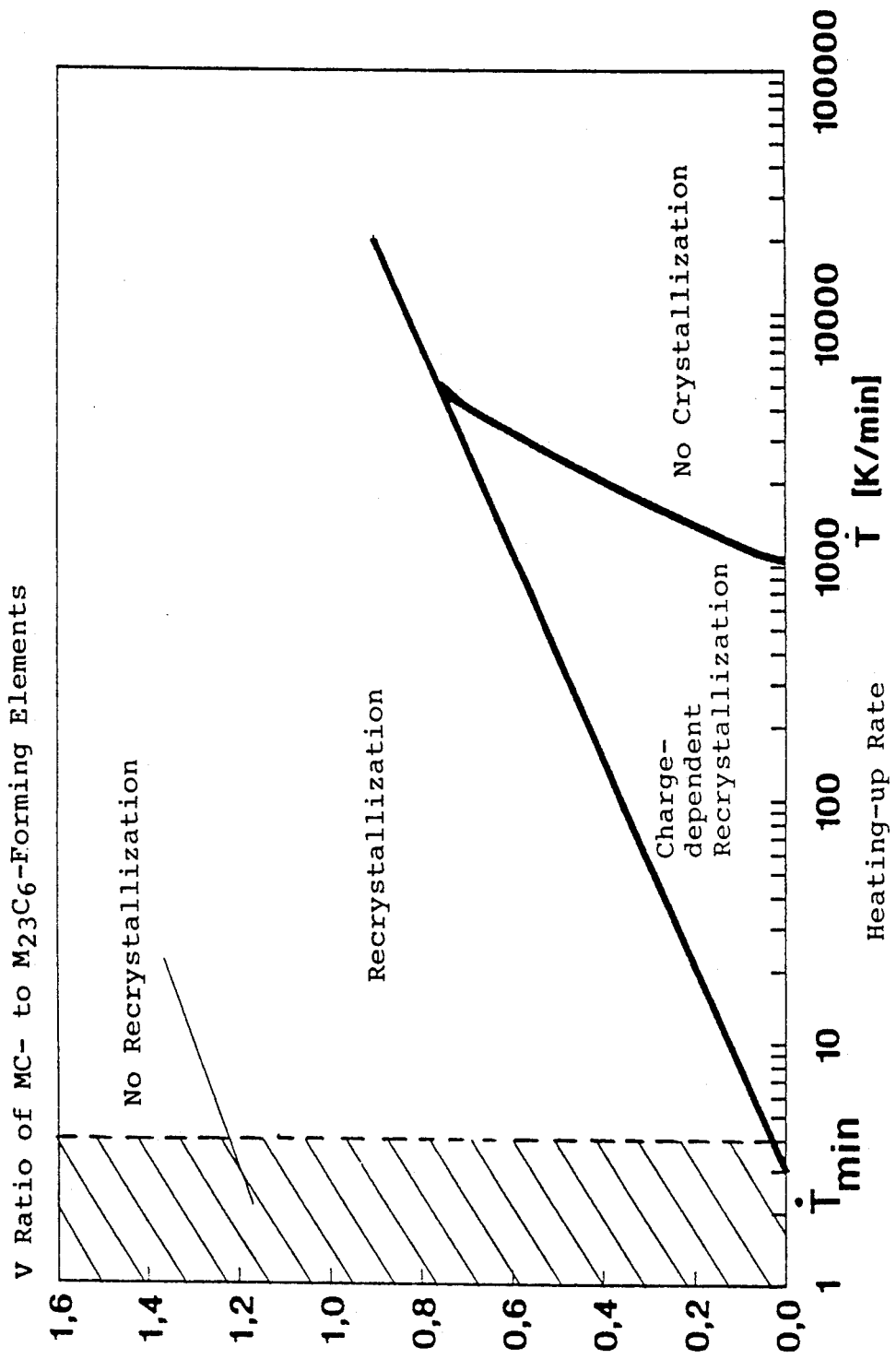

NICKEL-BASE SUPERALLOY

DESCRIPTION

This invention relates to a nickel-base superalloy for use in making section bars and shaped bodies having a coarse structure which consists of columnar grains and has been produced by a heat treatment.

It is known that section bars and shaped bodies can be made under a vacuum or protective gas by powder-metallurgical processes including extruding, hot pressing or hot forging from powders which consist of nickel-base superalloys and have been made, e.g., by mechanical alloying operations, and such section bars or shaped bodies can subsequently be subjected to a heat treatment for recyrstallization. This results in coarse and preferably columnar grains and the section bars or shaped bodies have the highest mechanical strength in the longitudinal direction of such grains. In accordance with EP-A-O 232 474 the section bars or shaped bodies are moved in the direction of deformation through the induction coil of a heater at a velocity of up to 240 mm/h in an operation in which the axial temperature-displacement gradient is between 7° and 20° C./mm and the temperature is between 1150° and 1350° C. That so-called zone annealing results in the formation of a recrystallization front, which extends at right anoles to the axial temperature-displacement gradient, and coarse columnar crystals extending in the longitudinal direction, i.e., in the direction of deformation, are obtained behind said front.

A successful recrystallization will depend on the composition of the nickel-base superalloys and on their thermal-mechanical treatment, i.e., on the degree of deformation, on the deformation temperature and on the velocity of deformation. For this reason it is necessary for alloys having a given composition to maintain fixed deformation parameters, which depend on the alloy, if a reliable recrystallization is to be effected.

But is has been found that in a number of applications only an incomplete recrystallization of the section bars and shaped bodies made of nickel-base superalloys may be achieved even though the specified deformation parameters had exactly been maintained. That incomplete recrystallization is due to the heating-up rate $\dot{T}$ (K/min) employed until the recrystallization temperature has been reached. That heating-up rate may be less than a certain minimum heating-up rate $\dot{T}_{min}$ or may exceed a certain maximum heating rate $\dot{T}_{max}$.

It is an object of the present invention to show how a reliable recrystallization of nickel-base superalloys can be effected independently of the above-mentioned deformation parameters.

That object is accomplished in that the maximum heating-up rate $\dot{T}_{max}$ employed until the recrystallization temperature has been reached is selected in dependence on the ratio V of one or more of the metal carbide-forming elements (MC-forming elements) hafnium, niobium, titanium and zirconium to one or both of the metal carbide-forming elements ($M_{23}C_6$) molybdenum and tungsten because the maximum heating rate $\dot{T}_{max}$ increases as the ratio V increases. On principle it will be sufficient if the nickel-base superalloy contains one MC-forming element.

According to a preferred feature of the invention the ratio V of MC-forming elements to $M_{23}C_6$-forming elements is equal to $$\frac{2.4 \text{ Hf} + 1.4 \text{ Nb} + 1.3 \text{ Ta} + 1.0 \text{ Ti} + 0.5 \text{ Zr (atom \%)}}{\text{Mo} + \text{W (atom \%)}} \geq 0.4$$

The ratio V of MC-forming elements to $M_{23}C_6$-forming elements is preferably $\geq 0.8$.

According to a preferred feature of the invention the superalloy is composed of

| |
|---|
| 12 to 25, preferably 17 to 22 wt. % Cr |
| 3 to 8, preferably 4.5 to 7 wt. % Al |
| 0 to 0.1, preferably 0.005 to 0.05 wt. % B |
| 0.01 to 0.1, preferably 0.02 to 0.07 wt. % C |
| 0 to 2, preferably 0.5 to 1.5 wt. % $Y_2O_3$ |
| 0 to 3, preferably 0.2 to 2 wt. % Hf |
| 0 to 7, preferably 0.5 to 5 wt. % Nb |
| 0 to 10, preferably 1 to 6.5 wt. % Ta |
| 0 to 5, preferably 0.5 to 3.5 wt. % Ti |
| 0 to 1, preferably 0.02 to 0.3 wt. % Zr |
| 0 to 10, preferably 2 to 6 wt. % Mo |
| 0 to 7, preferably 1.5 to 5 wt. % W | balance Ni.

The advantage afforded by the invention is particularly seen in that the selection of an optimum ratio V of MC-forming elements to $M_{23}C_6$-forming elements permits a raising of the maximum heating-up rate $\dot{T}_{max}$ and an increase of the $\dot{T}_{min}$ to $\dot{T}_{max}$ window so that the recrystallization can be facilitated.

The invention is illustrated more in detail and by way of example in the drawing showing a semilogarithmic divided system of coordinates, in which the curve representing the dependence of the maximum heating-up rate $\dot{T}_{max}$ on the ratio V of MC-forming elements to $M_{23}C_6$-forming elements.

A reliable recrystallization will be ensured in the region which lies above straightened exponential curve that intersects the axis of abscissas at a heating up rate $\dot{T}$ of 2 K/min and which at a heating-up rate T of 7000 K/min intersects the straight line which is parallel to the axis of abscissas and extends through the ratio V=0.8 on the axis of ordinates. That range is limited toward the axis of ordinates by the straight line which represents the minimum heating-up rate $\dot{T}_{min}$ and is parallel to the axis of ordinates. There will be no recrystallization below that straight line. In a region which is disposed below the exponential curve and begins at the minimum heating-up rate $\dot{T}_{min}$, superalloys having certain compositions can successfully be recrystallized if fixed deformation parameters, which depend on the alloy, are selected. That region is limited on the right by a straightened exponential curve, which intersects the axis of abscissas at a heating-up rate $\dot{T}=1000$ K/min and intersects the straight line which is parallel to the axis of abscissas at a heating-up rate T=5000 K/min and extends through the ratio V=0.75. On the right of that exponential curve a recrystallization as a function of the heating-up rate and of the ratio of MC-forming elements to $M_{23}C_6$-forming elements cannot be effected.

The invention will further be explained by the following examples.

1ST EXAMPLE

In a superalloy which has been produced by powder metallurgy and is composed of 20% by weight Cr, 6% by weight Al, 2% by weight Mo, 3.5% by weight W, 0.15% by weight Zr, 0.01% by weight B, <0.05% by weight C, 1.1% by weight $Y_2O_3$, balance nickel, the ratio V of MC-forming elements to $M_{23}C_6$-forming elements is equal to 0.05 so that the superalloy has only a highly restricted recrystallizability because the maximum heating-up rate $\dot{T}_{max}$ of that alloy extends in the range of the minimum heating-up rate $\dot{T}_{min}$.

2ND EXAMPLE

In a superalloy which has been produced by powder metallurgy and is composed of 20% by weight Cr, 6% by weight Al, 1% by weight Mo, 2% by weight W, 0.15% by weight Zr, 0.01% by weight B, <0.05% by weight C, 1.1% by weight $Y_2O_3$, balance nickel, the ratio V of MC-forming elements to $M_{23}C_6$forming elements is equal to 0.1. That alloy will have an incomply recrystallized structure if the required deformation parameters and the required heating-up rate are not exactly maintained. It is technologically difficult to maintain the heating-up rate in the small range in which a recrystallization can reliably be effected.

3RE EXAMPLE

In the superalloy which has been produced by powder metallurgy and is composed of 17% by weight Cr, 6% by weight Al, 2% by weight Mo, 3.5% by weight W, 2% by weight Ta, 1% by weight Hf, 0.15% by weight Zr, 0.01% by weight B, <0.05% by weight C, 1.1% by weight $Y_2O_3$, balance Ni, the ratio V of MC-forming elements to $M_{23}C_6$-forming elements is equal to 0.7 so that the maximum heating-up rate $\dot{T}_{max}$ amounts to 2000 K/min. That heating-up rate will not be reached, as a rule, in processes which are technologically relevant.

4TH EXAMPLE

In the superalloy which has been produced by powder metallurgy and is composed of 15% by weight Cr, 4.5% by weight Al, 2.5% by weight Ti, 2.0% by weight Mo, 4% by weight W, 2% by weight Ta, 0.15% by weight Zr, 0.01% by weight B, <0.05% by weight C, 1.1% by weight $Y_2O_3$, balance Ni, the ratio V of MC-forming elements to $M_{23}C_6$-forming elements is equal to 1.5 so that a complete recrystallization will be effected in all cases.

5TH EXAMPLE

In the superalloy which has been produced by powder metallurgy and is composed of 17% by weight Cr, 6% by weight Al, 2% by weight Mo, 3.5% by weight W, 2% by weight Ta, 0.5% by weight Nb, 0.15% by weight Zr, 0.01% by weight B, <0.05% by weight C, 1.1% by weight $Y_2O_3$, balance Ni, the ratio V of MC-forming elements to $M_{23}C_6$-forming elements is equal to 0.5 so that the maximum heating-up rate $\dot{T}_{max}$ equals 300 K/min and a reliable recrystallization will be ensured.

It will be understood that the specification and examples are illustrative but not limitative of the present invention and that other embodiments within the spirit and scope of the invention will suggest themselves to those skilled in the art.

We claim:

1. A nickel-base superalloy for use in making section bars and shaped bodies having a coarse structure which consists of columnar grains and has been produced by a heat treatment wherein the maximum heating-up rate $\dot{T}_{max}$ employed until the recrystallization temperature has been reached is selected from dependence on the ratio V of one or more of the metal carbide-forming elements (MC-forming elements) hafnium, niobium, tantalum, titanium and zirconium to one or both of the metal carbide-forming elements ($M_{23}C_6$) molybdenum and tungsten because the maximum heating rate $\dot{T}_{max}$ increases as the ratio V increases, the ratio V of MC-forming elements to $M_{23}C_6$-forming elements $$\frac{2.4 \text{ Hf} + 1.4 \text{ Nb} + 1.3 \text{ Ta} + 1.0 \text{ Ti} + 0.5 \text{ Zr (atom \%)}}{\text{Mo} + \text{W (atom \%)}} \geq 0.4.$$

2. A superalloy according to claim 1, wherein the ratio V of MC-forming elements to $M_{23}C_6$-forming elements is $\geq 0.8$.

3. A superalloy according to claim 1, of the composition

| |
|---|
| 12 to 25 wt. % Cr |
| 3 to 8 wt. % Al |
| 0 to 0.1 wt. % B |
| 0.01 to 0.1 wt. % C |
| 0 to 2 wt. % $Y_2O_3$ |
| 0 to 3 wt. % Hf |
| 0 to 7 wt. % Nb |
| 0 to 10 wt. % Ta |
| 0 to 5 wt. % Ti |
| 0 to 1 wt. % Zr |
| 0 to 10 wt. % Mo |
| 0 to 7 wt. % W | balance Ni.

4. A superalloy according to claim 1, of the composition

| |
|---|
| 17 to 22 wt. % Cr |
| 4.5 to 7 wt. % Al |
| 0.005 to 0.05 wt. % B |
| 0.02 to 0.07 wt. % C |
| 0.5 to 1.5 wt. % $Y_2O_3$ |
| 0.2 to 2 wt. % Hf |
| 0.5 to 5 wt. % Nb |
| 1 to 6.5 wt. % Ta |
| 0.5 to 3.5 wt. % Ti |
| 0.02 to 0.3 wt. % Zr |
| 2 to 6 wt. % Mo |
| 1.5 to 5 wt. % W | balance Ni.

* * * * *